United States Patent
Gunnam

(10) Patent No.: US 8,458,555 B2
(45) Date of Patent: Jun. 4, 2013

(54) BREAKING TRAPPING SETS USING TARGETED BIT ADJUSTMENT

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 311 days.

(21) Appl. No.: 12/827,652

(22) Filed: Jun. 30, 2010

(65) Prior Publication Data
US 2012/0005551 A1    Jan. 5, 2012

(51) Int. Cl.
*H03M 13/00*    (2006.01)
(52) U.S. Cl.
USPC .......................................... 714/752; 714/758
(58) Field of Classification Search
None
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 5,721,745 A | 2/1998 | Hladik et al. |
| 5,734,962 A | 3/1998 | Hladik et al. |
| 6,023,783 A | 2/2000 | Divsalar et al. |
| 6,236,686 B1 | 5/2001 | Kamishima |
| 6,307,901 B1 | 10/2001 | Yu et al. |
| 6,550,023 B1 | 4/2003 | Brauch et al. |
| 6,678,843 B2 | 1/2004 | Giulietti et al. |
| 6,745,157 B1 | 6/2004 | Weiss et al. |
| 6,760,879 B2 | 7/2004 | Giese et al. |
| 6,888,897 B1 | 5/2005 | Nazari et al. |
| 6,910,000 B1 | 6/2005 | Yedidia et al. |
| 7,143,333 B2 | 11/2006 | Blankenship et al. |
| 7,181,676 B2 | 2/2007 | Hocevar |

(Continued)

FOREIGN PATENT DOCUMENTS

| | | |
|---|---|---|
| JP | 2007036495 A | 11/2007 |
| JP | 2009100222 A | 5/2009 |

(Continued)

OTHER PUBLICATIONS

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

(Continued)

*Primary Examiner* — Steve Nguyen
(74) *Attorney, Agent, or Firm* — Mendelsohn, Drucker & Associates, P.C.; Craig M. Brown; Steve Mendelsohn

(57) ABSTRACT

In one embodiment, an LDPC decoder performs a targeted bit adjustment method to recover a valid codeword after the decoder has failed. In a first stage, a post processor initializes the decoder by saturating LLR values output by the decoder during the last (i.e., failed) iteration to a relatively small value. Then, two-bit trials are performed, wherein LLR values corresponding to two bits of the codeword are adjusted in each trial. Decoding is performed with the adjusted values, and if the number of unsatisfied check nodes exceeds a specified threshold, then a second stage is performed. The post processor initializes the decoder by saturating the LLR values output by the decoder during the last (i.e., failed) iteration of the first stage to a relatively small value. The second stage then performs single-bit adjustment trials, wherein one LLR value corresponding to one bit of the codeword is adjusted in each trial.

21 Claims, 5 Drawing Sheets

U.S. PATENT DOCUMENTS

| | | | |
|---|---|---|---|
| 7,219,288 | B2 | 5/2007 | Dielissen et al. |
| 7,237,181 | B2 | 6/2007 | Richardson |
| 7,296,216 | B2 * | 11/2007 | Shen et al. ............... 714/801 |
| 7,340,671 | B2 | 3/2008 | Jones et al. |
| 7,353,444 | B2 | 4/2008 | Owsley et al. |
| 7,457,367 | B2 | 11/2008 | Farhang-Boroujeny et al. |
| 7,689,888 | B2 | 3/2010 | Kan et al. |
| 7,725,800 | B2 | 5/2010 | Yang et al. |
| 7,730,377 | B2 | 6/2010 | Hocevar |
| 7,739,558 | B1 | 6/2010 | Farjadrad et al. |
| 7,752,523 | B1 | 7/2010 | Chaichanavong et al. |
| 7,770,090 | B1 | 8/2010 | Kons et al. |
| 7,805,642 | B1 | 9/2010 | Farjadrad |
| 7,895,500 | B2 | 2/2011 | Sun et al. |
| 7,904,793 | B2 | 3/2011 | Mokhlesi et al. |
| 7,941,737 | B2 | 5/2011 | Gopalakrishnan et al. |
| 7,949,927 | B2 | 5/2011 | Park et al. |
| 8,010,869 | B2 | 8/2011 | Wejn et al. |
| 8,020,070 | B2 | 9/2011 | Langner et al. |
| 8,037,394 | B2 | 10/2011 | Djurdjevic et al. |
| 8,046,658 | B2 | 10/2011 | Heinrich et al. |
| 8,051,363 | B1 | 11/2011 | Liu |
| 8,103,931 | B2 | 1/2012 | Wang et al. |
| 8,127,209 | B1 * | 2/2012 | Zhang et al. ............... 714/780 |
| 8,151,171 | B2 | 4/2012 | Blanksby |
| 8,156,409 | B2 | 4/2012 | Patapoutian et al. |
| 8,161,345 | B2 * | 4/2012 | Graef ............... 714/752 |
| 8,171,367 | B2 * | 5/2012 | Gao et al. ............... 714/752 |
| 8,205,134 | B2 | 6/2012 | Harrison et al. |
| 8,205,144 | B1 | 6/2012 | Yadav |
| 8,214,719 | B1 | 7/2012 | Sheng et al. |
| 8,219,878 | B1 * | 7/2012 | Varnica et al. ............... 714/758 |
| 8,255,763 | B1 | 8/2012 | Yang et al. |
| 8,301,984 | B1 | 10/2012 | Zhang et al. |
| 2002/0062468 | A1 | 5/2002 | Nagase et al. |
| 2002/0166095 | A1 | 11/2002 | Lavi et al. |
| 2005/0193320 | A1 | 9/2005 | Varnica et al. |
| 2005/0204255 | A1 | 9/2005 | Yeh et al. |
| 2005/0283707 | A1 | 12/2005 | Sharon et al. |
| 2006/0013306 | A1 | 1/2006 | Kim et al. |
| 2006/0036928 | A1 | 2/2006 | Eroz et al. |
| 2006/0107181 | A1 | 5/2006 | Dave et al. |
| 2006/0115802 | A1 | 6/2006 | Reynolds |
| 2006/0285852 | A1 | 12/2006 | Xi et al. |
| 2007/0011569 | A1 | 1/2007 | Vila Casado et al. |
| 2007/0011573 | A1 | 1/2007 | Farjadrad et al. |
| 2007/0011586 | A1 | 1/2007 | Belogolovyi et al. |
| 2007/0044006 | A1 | 2/2007 | Yang et al. |
| 2007/0071009 | A1 | 3/2007 | Nagaraj et al. |
| 2007/0089018 | A1 | 4/2007 | Tang et al. |
| 2007/0089019 | A1 | 4/2007 | Tang et al. |
| 2007/0124652 | A1 | 5/2007 | Litsyn et al. |
| 2007/0147481 | A1 | 6/2007 | Bottomley et al. |
| 2007/0153943 | A1 | 7/2007 | Nissila |
| 2007/0162788 | A1 | 7/2007 | Moelker |
| 2007/0220408 | A1 | 9/2007 | Huggett et al. |
| 2007/0234178 | A1 | 10/2007 | Richardson et al. |
| 2007/0234184 | A1 | 10/2007 | Richardson |
| 2008/0049869 | A1 | 2/2008 | Heinrich et al. |
| 2008/0082868 | A1 | 4/2008 | Tran et al. |
| 2008/0104485 | A1 | 5/2008 | Lyakh et al. |
| 2008/0109701 | A1 | 5/2008 | Yu et al. |
| 2008/0126910 | A1 | 5/2008 | Venkatesan et al. |
| 2008/0148129 | A1 | 6/2008 | Moon |
| 2008/0163032 | A1 | 7/2008 | Lastras-Montano |
| 2008/0235561 | A1 | 9/2008 | Yang |
| 2008/0276156 | A1 | 11/2008 | Gunnam et al. |
| 2008/0301517 | A1 * | 12/2008 | Zhong ............... 714/752 |
| 2008/0301521 | A1 | 12/2008 | Gunnam et al. |
| 2009/0063931 | A1 | 3/2009 | Rovini et al. |
| 2009/0083609 | A1 | 3/2009 | Yue et al. |
| 2009/0132897 | A1 | 5/2009 | Xu et al. |
| 2009/0150745 | A1 * | 6/2009 | Langner et al. ............... 714/752 |
| 2009/0235146 | A1 | 9/2009 | Tan et al. |
| 2009/0259912 | A1 | 10/2009 | Djordjevic et al. |
| 2009/0273492 | A1 | 11/2009 | Yang et al. |
| 2009/0307566 | A1 * | 12/2009 | No et al. ............... 714/784 |
| 2009/0319860 | A1 * | 12/2009 | Sharon et al. ............... 714/752 |
| 2010/0037121 | A1 | 2/2010 | Jin et al. |
| 2010/0042806 | A1 | 2/2010 | Gunnam |
| 2010/0042890 | A1 | 2/2010 | Gunnam |
| 2010/0050043 | A1 | 2/2010 | Savin |
| 2010/0058152 | A1 | 3/2010 | Harada |
| 2010/0088575 | A1 | 4/2010 | Sharon et al. |
| 2010/0192043 | A1 * | 7/2010 | Alrod et al. ............... 714/763 |
| 2011/0041029 | A1 | 2/2011 | Yedidia et al. |

FOREIGN PATENT DOCUMENTS

| | | |
|---|---|---|
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Sripimanwat, K., "Turbo Code Applications: A Journey From a Paper to Realization", Oct. 26, 2005, Springer, p. 27.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp.738-743.

David J.C. Mackay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag- "Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee- "Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Richardson, Tom, "Error Floors of LDPC Codes," Allerton Conf. on Communication, Control and Computing, (Monticello, Illinois), Oct. 2003, pp. 1426-1435.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Computers, Oct. 28, 2005— Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \Big\} r=4 \end{matrix}$$

$\underbrace{\qquad\qquad\qquad\qquad\qquad}_{c=10}$

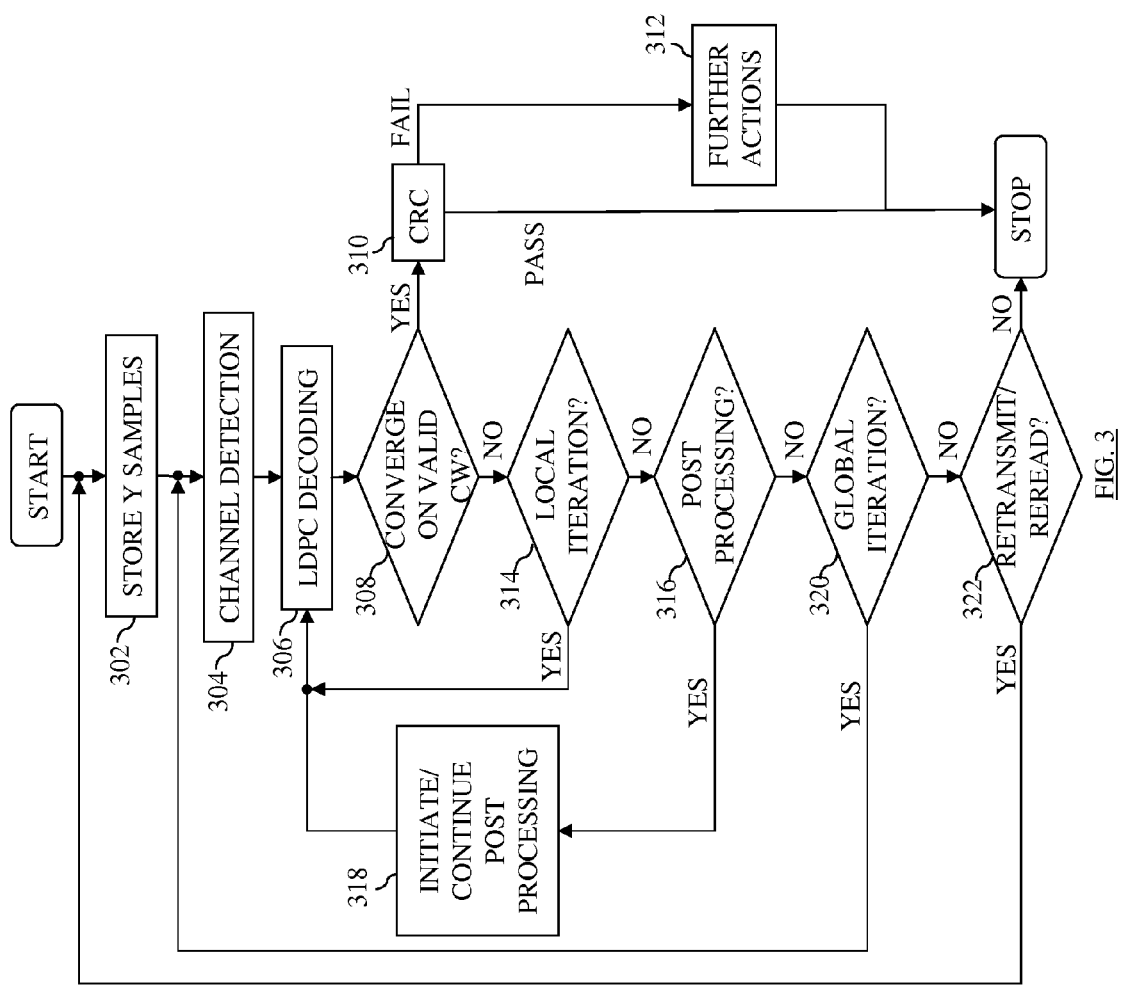

BREAKING TRAPPING SETS USING TARGETED BIT ADJUSTMENT

CROSS-REFERENCE TO RELATED APPLICATIONS

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
U.S. patent application Ser. No. 12/675,981 filed on Mar. 2, 2010,
U.S. patent application Ser. No. 12/677,322 filed Mar. 10, 2010,
U.S. patent application Ser. No. 12/680,810 filed Mar. 30, 2010,
U.S. application Ser. No. 12/524,418 filed on Jul. 24, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application no. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009,
U.S. patent application Ser. No. 12/510,667 filed on Jul. 28, 2009,
U.S. patent application Ser. No. 12/644,622 filed on Dec. 22, 2009,
U.S. patent application Ser. No. 12/644,181 filed on Dec. 22, 2009, and
U.S. patent application Ser. No. 12/766,038 filed on Apr. 23, 2010,
the teachings of all of which are incorporated herein by reference in their entirety.

BACKGROUND OF THE INVENTION

1. Field of the Invention

The present invention relates to signal processing, and, more specifically but not exclusively, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break the trapping sets and/or (ii) prevent the LDPC decoder from converging on trapping sets.

SUMMARY OF THE INVENTION

In one embodiment, the present invention is a receiver-implemented method for recovering an EC-encoded codeword. The method comprises performing a first stage of EC decoding on a first set of input values to generate a first set of output values, one or more of which correspond to one or more first-stage unsatisfied check nodes (USCs). Further, a second stage of EC decoding is performed on a second set of input values to generate a second set of output values, one or more of which correspond to one or more second-stage USCs. The second set of input values is based on the first set of output values. Additionally, one or more of the input values of the second set of input values are generated by adjusting one or more corresponding output values of the first set of output values, wherein each of the one or more corresponding output values of the first set of output values is associated with a first-stage USC. A difference of (i) the number of first-stage USCs and (ii) the number of second-stage USCs is compared to a specified threshold value, and a subsequent stage of EC decoding is selected based on the comparison. The selected subsequent stage of EC decoding is then performed.

In one embodiment, the present invention is an apparatus for recovering an EC-encoded codeword. The apparatus comprises an EC decoder and a controller that controls the EC decoder. The EC decoder performs a first stage of EC decoding on a first set of input values to generate a first set of output values, one or more of which correspond to one or more first-stage unsatisfied check nodes (USCs). Further, the EC decoder performs a second stage of EC decoding on a second set of input values to generate a second set of output values, one or more of which correspond to one or more second-stage USCs. The second set of input values is based on the first set of output values. Additionally, one or more of the input values of the second set of input values are generated by adjusting one or more corresponding output values of the first set of output values, wherein each of the one or more corresponding output values of the first set of output values is associated with a first-stage USC. The controller compares a difference of (i) the number of first-stage USCs and (ii) the number of second-stage USCs to a specified threshold value, and selects a subsequent stage of EC decoding based on the comparison. The EC decoder then performs the selected subsequent stage of EC decoding.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check matrix that may be used to implement a regular, quasi-cyclic (QC) low-density parity-check (LDPC) code;

FIG. 3 shows a simplified flow diagram of a turbo-equalization method 300 that may be performed by a receiver that employs LDPC decoding according to one embodiment of the present invention;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72×10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, . . . , 287, and each of the 720 columns corresponds to an $n^{th}$ variable node (also referred to as a bit node), where n ranges from 0, . . . , 719. Further, each check node is connected to $w_r$=10 variable nodes as indicated by the 1s in a row, and each variable node is connected to $w_c$=4 check nodes as indicated by the is in a column. H-matrix 100 may be described as a regular LDPC code since all rows of H-matrix 100 have the same hamming weight $w_r$ and all columns of H-matrix 100 have the same hamming weight $w_c$.

Figure 2:
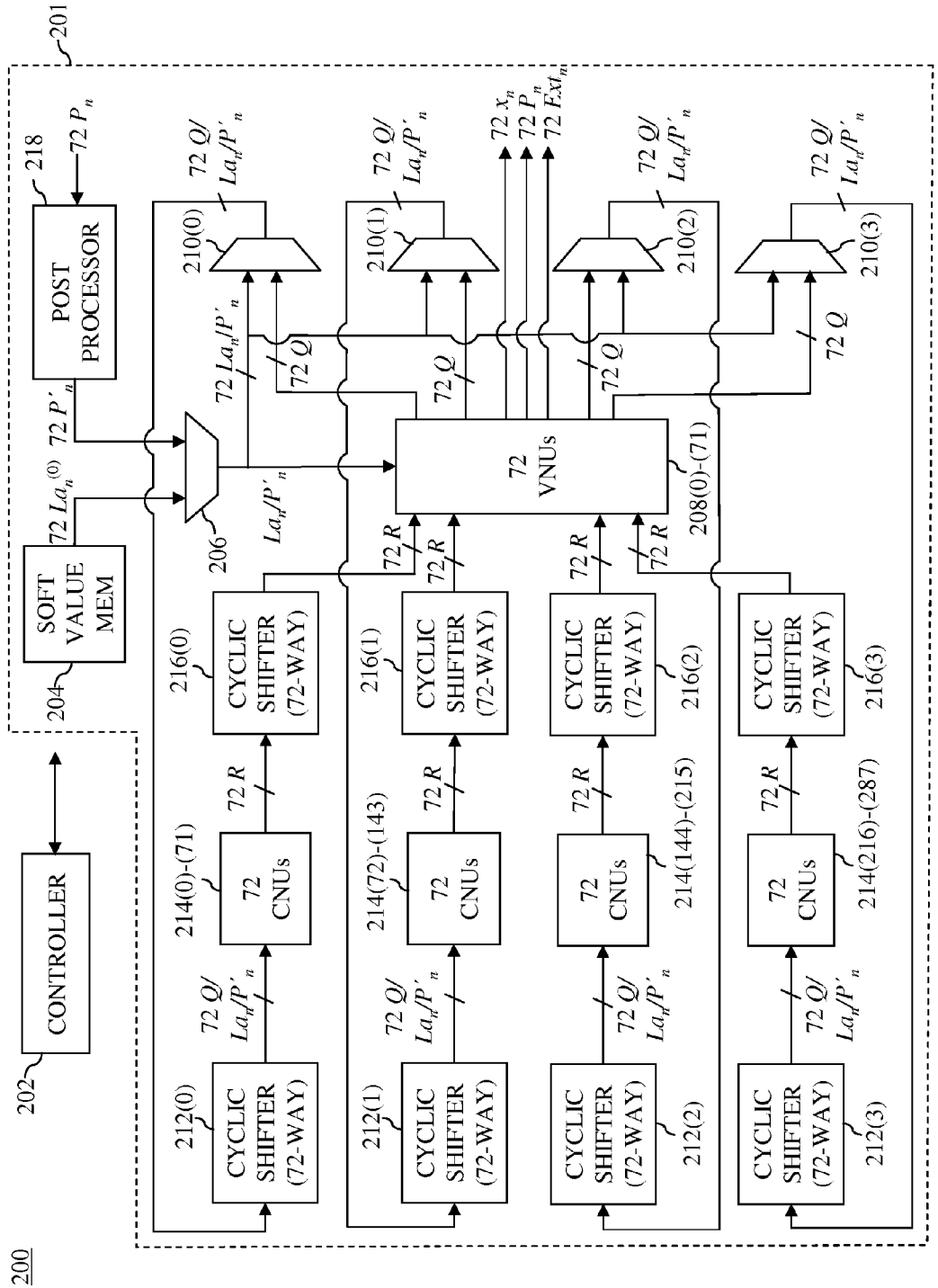
FIG. 2 shows a simplified block diagram of a portion of a receiver 200 according to one embodiment of the present invention.

FIG. 2 shows a simplified block diagram of a portion of a receiver 200 according to one embodiment of the present invention. Receiver 200, which includes LDPC decoder 201 and controller 202, may be implemented in, for example, hard-disk drive electronics or any other suitable signal processing device. Further, receiver 200 may comprise other circuitry that is not shown such as a channel detector, an analog front end, and any other suitable circuitry. LDPC decoder 201 may be used to decode codewords encoded using an H-matrix such as H-matrix 100 of FIG. 1. For each codeword received, LDPC decoder 200 receives 720 channel soft-output values (e.g., log-likelihood ratios (LLR)) $La_n^{(0)}$ from a channel detector such as a soft-output Viterbi detector and stores these channel soft-output values $La_n^{(0)}$ in soft-value memory 204. Each channel soft-output value $La_n^{(0)}$ corresponds to one bit of the codeword, and each codeword is decoded iteratively using a message-passing algorithm. The term "soft-output value" refers to a value having a hard-decision bit (i.e., the most-significant bit) and one or more confidence-value bits (i.e., the least significant bits).

In general, LDPC decoder 200 decodes the 720 channel soft-output values) $L_n^{(0)}$ (i.e., messages) using a block-serial message-passing schedule. The messages are updated using (i) 288 check-node units (CNUs) 214, where each CNU 214 performs check-node updates for one row (i.e., the $m^{th}$ check node) of H-matrix 100 and (ii) 72 variable-node units (VNUs) 208, where each VNU 208 performs the variable-node updates for ten columns (i.e., the $n^{th}$ variable nodes) of H-matrix 100. CNUs 214(0)-(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 208(0)-(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. A local iteration of LDPC decoder 200 is complete after all check-node updates and variable-node updates have been performed (i.e., one pass through LDPC decoder 200 has been performed). The term "local iteration" refers to one iteration internal to the LDPC decoder itself.

During the initial iteration, 720 channel soft-output values $La_n^{(0)}$ are provided to multiplexer 206. Multiplexer 206 may also receive 720 soft values $L_n$, as discussed below in relation to post processor 218, during subsequent iterations. The 720 channel soft-output values $La_n^{(0)}$ are provided to multiplexers 210(0)-(3) at a rate of 72 channel soft-output values $La_n^{(0)}$ per clock cycle such that each multiplexer 210 receives all 72 channel soft-output values $La_n^{(0)}$ in the set. Each multiplexer 210 also receives 72 variable-node messages (herein referred to as Q messages) that are generated as discussed in further detail below from VNUs 208(0)-(71). During the first iteration of LDPC decoder 200, multiplexers 210(0)-(3) select the sets of 72 channel soft-output values $La_n^{(0)}$ that they receive to output to 72-way cyclic shifters 212(0)-(3), respectively. The initial Q messages, which are not selected, may be Q messages generated for a previously considered codeword. During subsequent iterations of LDPC decoder 200, multiplexers 210(0)-(3) select the sets of 72 Q messages that they receive from VNUs 208(0)-(71) to output to 72-way cyclic shifters 212(0)-(3), respectively. For the following discussion, it will be understood that any reference to Q messages applies to channel soft-output values $La_n^{(0)}$ during the first iteration of LDPC decoder 200.

Cyclic shifters 212(0)-(3) cyclically shift the sets of 72 Q messages that they receive based on a cyclic-shift signal that may be received from, for example, controller 202. Controller 202 may be implemented as an integral component to LDPC decoder 200 or may be implemented as a component that is separate from LDPC decoder 200. The cyclic-shift signal corresponds to cyclic-shift factors of the circulants of H-matrix 100 of FIG. 1. For example, during the first clock cycle of an iteration of LDPC decoder 200, cyclic shifters 212(0)-(3) may shift their respective sets of 72 Q messages based on the shift factors of circulants $B_{1,1}, B_{2,1}, B_{3,1},$ and $B_{4,1}$ of H-matrix 100 of FIG. 1, respectively. During the second clock cycle of an iteration of LDPC decoder 200, cyclic shifters 212(0)-(3) may shift their respective sets of 72 Q messages based on the shift factors of circulants $B_{1,2}, B_{2,2}, B_{3,2},$ and $B_{4,2}$, respectively. Cyclic shifters 212(0)-(3) then provide their respective 72 cyclically shifted Q messages to CNUs 214(0)-(287), such that each CNU 214 receives a different one of the Q messages.

Each CNU 214 (i) receives a number of Q messages equal to the hamming weight $w_r$ of a row of H-matrix 100 (e.g., 10) at a rate of one Q message per clock cycle and (ii) generates $w_r$ check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)} \max(\kappa_{mn}^{(i)} - \beta, 0) \quad (1)$$

$$\kappa_{mn}^{(i)} = |R_{mn}^{(i)}| = \min_{n' \in N(m)/n} |Q_{n'm}^{(i-1)}| \quad (2)$$

$$\delta_{mn}^{(i)} = \left( \prod_{n' \in N(m)/n} \mathrm{sign}(Q_{n'm}^{(i-1)}) \right), \quad (3)$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{nm}^{(i-1)}$ represents the Q message corresponding to the $n^{th}$ variable node and the check node of H-matrix 100 for the $(i-1)^{th}$ iteration, (iii) $\beta$ represents an offset value that varies with code parameters, and (iv) the function sign indicates that the multiplication operation (i.e., $\Pi$) is performed on the signs of the $Q_{nm}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 214 corresponding to the $m^{th}$ check node (i.e., row) generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r-1=10-1$). Note that, for the first iteration, channel soft-output values $La_n^{(0)}$ received from soft-value memory 204 are used in Equations (2) and (3) in lieu of the Q messages for the prior iteration (i.e., $Q_{n'm}^{(0)}=La_{n'm}^{(0)}$).

Cyclic shifters 216(0)-(3) receive sets of 72 R messages from their respective CNUs 214 and cyclically shift the sets of 72 R messages according to the cyclic shifts of the circulants $B_{j,k}$ of H-matrix 100 of FIG. 1. Essentially, cyclic shifters 216(0)-(3) reverse the cyclic shifting of cyclic shifters 212(0)-(3). For example, if cyclic shifters 212(0)-(3) perform cyclic upshifting, then cyclic shifters 216(0)-(3) may perform cyclic downshifting.

Cyclic shifters 216(0)-(3) provide 4×72 cyclically shifted R messages to VNUs 208(0)-(71), such that each VNU 208 receives four of the R messages, one from each cyclic shifter 216. Each VNU 208 updates each of the four Q messages that it generates as shown in Equation (4):

$$Q_{mn}^{(i)} = La_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) an initial channel soft-output value $La_n^{(0)}$ received from soft-output value memory 204 that corresponds to the $n^{th}$ variable node. Each VNU 208, which may be implemented using adder circuits, outputs the four updated Q messages that it generates, such that a different one of the four messages is provided to a different corresponding MUX 210.

In addition to outputting four updated Q messages, each VNU 208 outputs (i) a multi-bit extrinsic LLR value, (ii) a hard-decision output bit, and (iii) a multi-bit P value. Each extrinsic LLR value may be represented as shown in Equation (5):

$$\text{Extrinsic Value}_n = \sum_{m \in M(n)} R_{mn}^{(i)}, \quad (5)$$

where m is a check node in the set M(n) of all check nodes connected to the $n^{th}$ variable node (i.e., m∈M(n)). Each P value may be generated using Equation (6) as follows:

$$P_n = La_n^{(0)} + \sum_{m \in M(n)} R_{mn}^{(i)}, \text{ and} \quad (6)$$

each hard-decision bit $\hat{x}_n$ may be generated based on Equations (7) and (8) below:

$$\hat{x}_n = 0 \text{ if } P_n \geq 0 \quad (7)$$

$$\hat{x}_n = 1 \text{ if } P_n < 0. \quad (8)$$

$P_n$ is determined for each variable node by adding the extrinsic value from Equation (5) to the initial channel soft-output value $La_n^{(0)}$ received from soft-value memory 204 via MUX 206 that corresponds to the $n^{th}$ variable node. If $P_n$ is greater than or equal to zero, then the hard-decision bit $\hat{x}_n$ is equal to zero, as shown in Equation (7). If $P_n$ is less than zero, then the hard-decision bit $\hat{x}_n$ is equal to one, as shown in Equation (8). An iteration of LDPC decoding (herein referred to as a local iteration) is complete when 720 hard-decision bits $\hat{x}_n$ have been generated (i.e., after all check nodes and bit nodes of H-matrix 100 have been updated), where each hard-decision bit $\hat{x}_n$ corresponds to a bit of the LDPC-encoded codeword. To further understand the operation of LDPC decoders in the context of a signal processing receiver, and more specifically in the context of a turbo equalizer of a signal processing receiver, consider FIG. 3.

FIG. 3 shows a simplified flow diagram of a turbo-equalization method 300 that may be performed by a receiver that employs LDPC decoding according to one embodiment of the present invention. Turbo-equalization method 300 may be implemented using LDPC decoder 200 or any other suitable LDPC decoder; however, for ease of discussion, turbo-equalization method 300 is described relative to its use with LDPC decoder 200. Upon start-up, turbo-equalization method 300 stores y-samples (action 302) that are received from, for example, a hard disk platter or other communications device. The y-samples are provided to a channel detector, which implements a channel detection method (action 304), such as Viterbi soft-output detection or any other suitable channel detection method.

The channel detector provides soft-output values to soft-value memory 204 of LDPC decoder 200. LDPC decoder 200 performs a local iteration of LDPC decoding (action 306) as described above in relation to LDPC decoder 200. After 720 hard-decision bits $\hat{x}_n$ have been generated, the turbo-equalizer performs decision 308 to determine whether or not LDPC decoder 200 has converged on a valid codeword. In particular, a parity check is performed by, for example, a syndrome check calculator (not shown), using the hard-decision bits $\hat{x}_n$. The syndrome check calculator may be implemented as part of controller 202 or as a separate logic circuit. To perform a parity check, the 720-element vector $\hat{x}$ formed from 720 hard-decision bits $\hat{x}_n$ output from VNUs 208(0)-(71) is multiplied by the transpose $H^T$ of H-matrix 100 of FIG. 1 (assuming binary summation) to generate a 288-bit vector (i.e., syndrome), where each bit of the 288-bit syndrome corresponds to one of the 288 check nodes (i.e., rows) of H-matrix 100.

If each element of the resulting 288-bit vector is equal to zero (i.e., $\hat{x}H^T=0$), then LDPC decoder 200 has converged on a valid codeword and a cyclic-redundancy check (CRC) (action 310) may be performed by, for example, controller 202 to determine whether the valid codeword is the correct codeword (i.e., the codeword that was transmitted). When CRC check is part of the encoding scheme, typically a number r of CRC check bits are appended to the user data at the transmitter before LDPC encoding such that, upon decoding, the 720-element vector $\hat{x}$ output from VNUs 208(0)-(71) comprises (i) the user data transmitted by the transmitter and (ii) the r CRC check bits. To perform the CRC check, the user data may be divided by a keyword that is known a priori by the receiver and the remainder of the division process may be compared to the r CRC check bits. If the remainder is equal to the r CRC check bits, then the CRC check has passed indicating that LDPC decoder 200 has converged on the correct codeword and decoding for the subject codeword is stopped. If the remainder is not equal to the r CRC check bits, then the CRC check has failed indicating that LDPC decoder 200 has converged on a valid codeword that is not the correct codeword (i.e., the valid codeword has one or more missatisfied check nodes). In this case, further actions 312 may be taken to recover the correct codeword, such as a retransmission of the data. Re-transmission of the data corresponds to re-execution of method 300 from the start.

If, in decision 308, one or more elements of the resulting 288-bit vector are equal to one (i.e., $\hat{x}H^T \neq 0$), then LDPC decoder 200 has not converged on a valid codeword. Each element of the 288-bit vector that has a value of one is considered an unsatisfied check node (USC), and each element of the 288-bit vector that has a value of zero is either (i) a satisfied check node or (ii) a missatisfied check node (MSC) (i.e., a check node that falsely shows as satisfied). If LDPC decoder 200 has not converged on a valid codeword, then controller 202 determines whether or not to perform another local iteration of LDPC decoding (decision 314).

Decision 314 may involve performing one or more suitable methods. According to a first method, controller 202 may determine whether a trapping set (a,b) has been encountered, where b is the number of unsatisfied check nodes in the trapping set, and a is the number of erroneous bit nodes (EBNs) associated with those unsatisfied check nodes. The majority of trapping sets typically comprise fewer than five unsatisfied check nodes and fewer than ten erroneous bit nodes. Determining whether LDPC decoder 200 has encountered a trapping set may be performed using any suitable method. For example, the decoder could track the number ($b_{observed}$) of unsatisfied check nodes over several iterations. If, over several iterations, the number of unsatisfied check nodes is relatively stable, then this could be indicative of a trapping set. Determining whether the number of unsatisfied check nodes is relatively stable may be performed by tracking the variance of the number of unsatisfied check nodes over several iterations.

As yet another example of this first method, LDPC decoder 200 could determine whether (i) the vector resulting from $\hat{x}H^T$ possesses a number ($b_{observed}$) of unsatisfied check nodes that is greater than zero and less than a specified number ($b_{max}$) of unsatisfied check nodes (e.g., 16) and (ii) the particular configuration of unsatisfied check nodes has remained relatively stable (i.e., the number and locations of the unsatisfied check nodes have not changed) for several local iterations of LDPC decoder 200 (e.g., two or three iterations). If, over several iterations, the number and configuration of unsatisfied check nodes are relatively stable, then this could be indicative of a trapping set. As even yet another example of this first method, LDPC decoder 200 could just consider whether the configuration of unsatisfied check nodes has remained relatively stable.

According to a second method, controller 200 may compare the number of local iterations performed by LDPC decoder 200 to a specified number of iterations (i.e., an iteration threshold). Note that this method could be used in conjunction with the above-mentioned method for determining whether a trapping set has been encountered. For example, LDPC decoder 200 could continue decoding as long as (i) a trapping set has not been encountered, and (ii) LDPC decoder 200 has not performed the specified number of iterations. If either (i) a trapping set is encountered, or (ii) LDPC decoder 200 has performed the specified number of iterations, then decoding is discontinued. The first method may be advantageous when LDPC decoder 200 converges on a trapping set before the specified number of iterations has been reached. By identifying a trapping set before the specified number of iterations, the decoder can avoid performing unnecessary iterations. The second method may be advantageous when the number and/or configuration of trapping sets do not stabilize after a specified number of iterations. This may prevent LDPC decoder 200 from running for extended periods of time, resulting in increased latency of LDPC decoder 200.

If controller 202 determines that LDPC decoder 200 has (i) not reached the specified iteration threshold and (ii) not converged on a trapping set, then processing returns to action 306 to perform another local LDPC decoding iteration. If, on the other hand, controller 202 determines that LDPC decoder 200 has either (i) reached the specified iteration threshold or (ii) converged on a trapping set, then controller 202 determines whether or not to perform further actions to improve the chances of recovering a valid codeword. For example, the turbo equalizer may perform (i) LDPC decoding using a suitable post-processing method (decision 316), (ii) one or more additional global iterations (decision 320), or (iii) any combination of post-processing, global iterations, and local iterations. A global iteration is an iteration that includes channel detection and one or more local iterations of the LDPC decoder.

Controller 204 may determine whether or not to perform one of these actions by, for example, determining whether the number ($b_{observed}$) of unsatisfied check nodes exceeds a specified number ($b_{max}$) of unsatisfied check nodes (e.g., 16), where $b_{max}$ may be determined experimentally. If the number ($b_{observed}$) of unsatisfied check nodes is less than or equal to the specified number ($b_{max}$) of unsatisfied check nodes, then it is likely that LDPC decoder 200 has converged on a trapping set (i.e., an observed trapping set) that may be broken. The order in which post-processing methods and global iterations are performed may vary from one embodiment to the next. For example, the turbo equalizer could perform a maximum number of global iterations. If LDPC decoder 200 does not converge within the maximum number of global iterations, then the turbo equalizer could perform one or more post-processing methods to converge on a valid codeword. As another example, the turbo equalizer could perform a post-processing method before performing further global iterations.

A number of different post-processing methods (action 318) may be used to break the observed trapping set. For example, in one category of post-processing methods known as list decoding, the observed trapping set is matched against a database of trapping sets known a priori by the decoder. To perform list decoding, the observed trapping set is compared to the known trapping sets in the database until either (i) a match is found or (ii) it is determined that none of the known trapping sets match the observed trapping set. If a known trapping set is found in the database that matches the observed trapping set, then erroneous bit node index value(s) corresponding to the trapping set are retrieved from the trapping-set database. Then, the channel soft-output values $La_n$ corresponding to the erroneous bit node index value(s) are adjusted, and the decoder is restarted using the adjusted channel soft-output values $La_n$. Often, adjusting one or two channel soft-output values $La_n$ is sufficient to break the trapping set, and the re-started decoder will converge on the correct codeword. More detailed discussions of list-decoding methods are provided in PCT patent application no. PCT/US08/86523, PCT patent application no. PCT/US08/86537, and U.S. patent application Ser. No. 12/540,002.

In some cases, an observed trapping set might not be known a priori by the LDPC decoder (i.e., not stored in the database), and thus, methods other than list decoding might be needed to break the trapping set. In addition to, or as an alternative to, list decoding techniques, LDPC decoder 200 could implement a targeted-bit adjustment technique that does not rely on a priori knowledge of trapping sets. As an example, consider the technique represented in FIG. 4 below.

If, after decision 308, controller 204 determines that the number ($b_{observed}$) of unsatisfied check nodes exceeds a specified number ($b_{max}$) of unsatisfied check nodes, then it is likely that LDPC decoder 200 has experienced an error in the communication channel, such as a scratch on the surface of a hard disk. In such a case, it is not likely that a post-processing method or another global iteration would be suitable for recovering a valid codeword. Thus, the turbo-equalizer may decide to retransmit (or reread in the case of a hard-disk drive) the data (decision 322) and return to action 302. Alternatively, if the turbo-equalizer is not able to recover a valid codeword, the turbo-equalizer might stop processing for the subject codeword altogether.

Figure 4A:
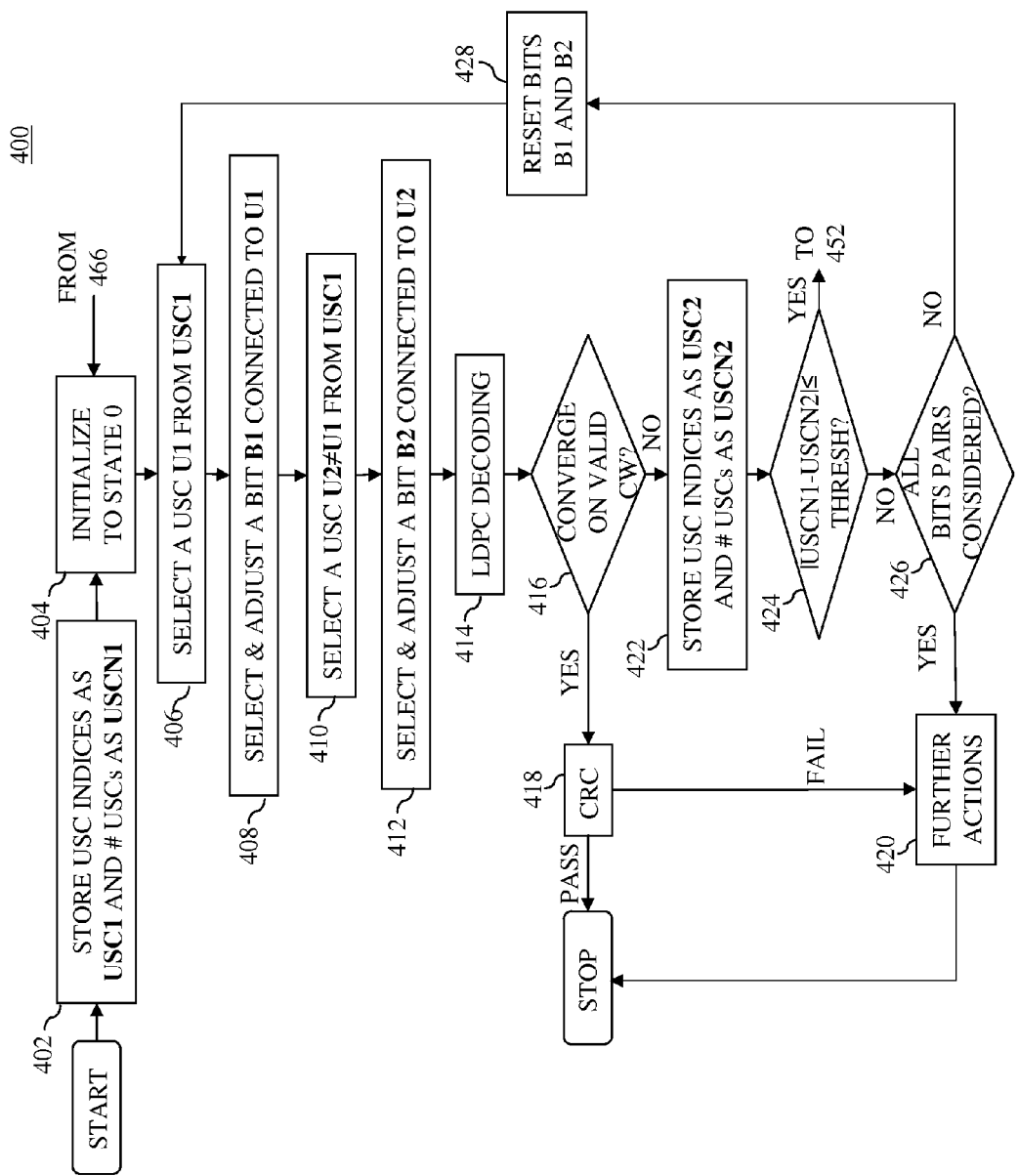
FIG. 4A shows a simplified flow diagram of a first stage of processing according to one embodiment of the present invention that may be performed by a post processor such as the post processor in FIG. 2.
Figure 4B:
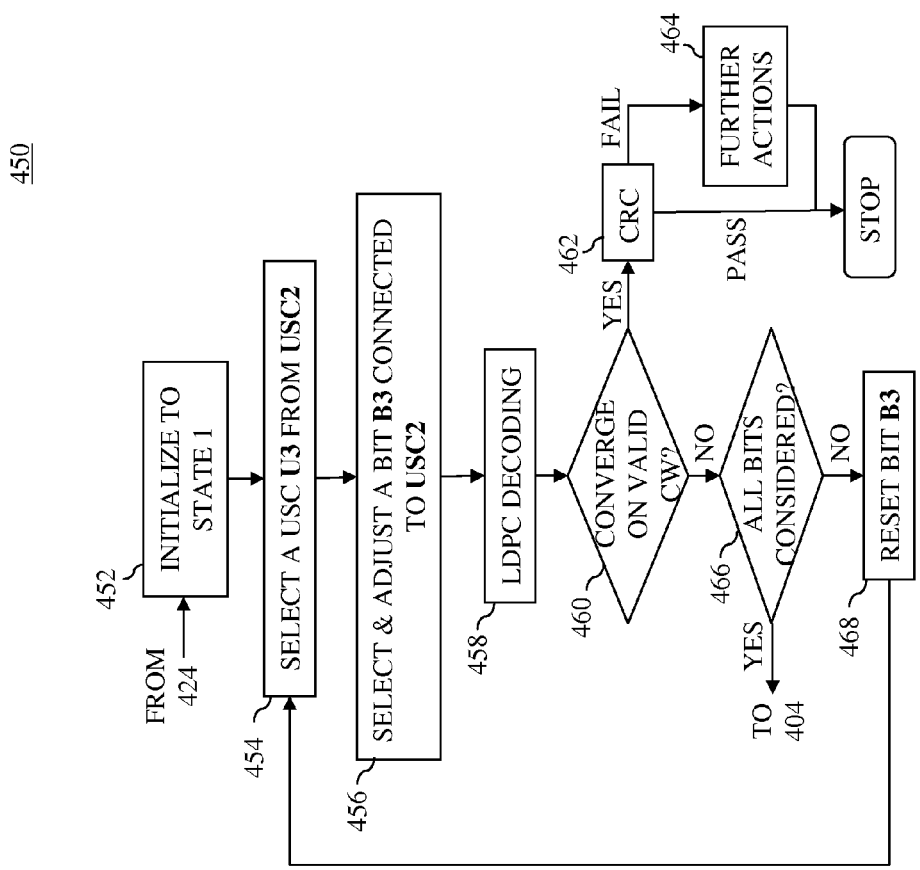
FIG. 4B shows a simplified flow diagram of a second stage of processing according to one embodiment of the present invention that may be performed by a post processor such as the post processor in FIG. 2.

FIG. 4 shows a simplified flow diagram of a two-stage targeted bit-adjustment technique according to one embodiment of the present invention that may be implemented by an LDPC decoder. In particular, FIG. 4A shows a simplified flow diagram of a first stage 400 of the two-stage targeted bit-adjustment technique, and FIG. 4B shows a simplified flow diagram of a second stage 450 of the two-stage targeted bit-adjustment technique. The two-stage bit-adjustment technique of FIG. 4 may be implemented using any suitable error-correction decoder, including layered-LDPC decoders. For ease of discussion, the technique of FIG. 4 is discussed in the context of LDPC decoder 200 of FIG. 2. In general, after initial LDPC decoding of a received LDPC-encoded codeword is unsuccessful (e.g., a trapping set is encountered or the predetermined number of iterations are reached), and controller 204 has decided to perform a post-processing method, first stage 400 performs one or more two-bit targeted-bit adjustment trials based on the output of the last (i.e., failed) LDPC decoding iteration, where two bits of the LDPC-encoded codeword are adjusted in each two-bit trial. If one of the two-bit targeted-bit adjustment trials reduces the number of unsatisfied check nodes within a threshold amount, then second stage 450 performs one or more single-bit targeted bit adjustment trials based on the output of first stage 400, where one bit of the LDPC-encoded codeword is adjusted in each single-bit trial.

Initially, after a determination is made to perform a post-processing technique (as described above), post processor 218 of LDPC decoder 200 performs first stage 400 of the two-stage targeted-bit adjustment technique. In particular, post processor 218 performs action 402 to store (i) the indices of the unsatisfied check nodes (USCs) as set USC1 and (ii) the number of unsatisfied check nodes as parameter USCN1. The indices of unsatisfied check nodes and number of unsatisfied check nodes are determined from the syndrome of the last (i.e., failed) decoder iteration. Note that any reference herein to an iteration also applies to a sub-iteration in the case of a layered-LDPC decoder, where a sub-iteration corresponds to the processing of one layer of the H-matrix.

Next, post processor 218 performs action 404 to initialize LDPC decoder 200 to State 0. In so doing, post processor 218, which receives 720 $P_n$ values from VNUs 208(0)-(71) during the last decoder iteration at a rate of 72 $P_n$ values per clock cycle, sets all 720 $P_n$ values to a relatively small value by, for example, saturating the $P_n$ values to approximately 15% of the largest positive or negative LLR values. As an example, suppose that the $P_n$ values are represented using 5 bits, where the most-significant bit (MSB) is a hard-decision bit, and the four least-significant bits (LSBs) form a 4-bit confidence value. When represented in 2s-complement format, the possible $P_n$ values range from −16 (i.e., binary 10000), . . . , +15 (i.e., binary 01111). All negative $P_n$ values (i.e., those having an MSB equal to one) are saturated to negative two, and all positive $P_n$ values (i.e., those having an MSB equal to zero are saturated to positive two (i.e., if MSB=1, then $P_n$ is saturated to −2; otherwise, $P_n$ is saturated to +2). The 720 $P_n$ values initialized to State 0 are then stored in memory for possible future use.

Once LDPC decoder 200 is initialized to State 0, post processor 218 (i) selects an unsatisfied check node U1 from the set USC1 of unsatisfied check nodes (action 406), and (ii) selects a saturated $P_n$ value corresponding to a bit B1 connected to unsatisfied check node U1 (action 408). Check node U1 may be selected sequentially from the set USC1 of unsatisfied check nodes and $P_n$ may be selected sequentially from the bits connected to unsatisfied check node U1. Post processor 218 adjusts the selected saturated $P_n$ value by flipping the hard-decision bit (a.k.a. sign bit or MSB) and setting a magnitude of the resulting $P_n$ value to a relatively large value. Expanding on the example above, suppose post processor 218 selects a $P_n$ value having an MSB equal to one. The sign bit is flipped to zero, and the magnitude of the resulting $P_n$ value may be set to the maximum possible value (e.g., 15) (i.e., if hard decision=1, then $P_n$ is set to +15). If, on the other hand, post processor 218 selects a $P_n$ value having an MSB equal to zero, then the sign bit is flipped to one, and the magnitude of the resulting $P_n$ value may be set to the maximum possible value (e.g., 16) (i.e., if hard decision=0, then $P_n$ is set to −16). The adjusted $P_n$ value replaces the corresponding saturated $P_n$ value in memory.

Post processor 218 also performs action 410 to select a second unsatisfied check node U2 from the set USC1 of unsatisfied check nodes. The second unsatisfied check node U2 is selected to be different from the first unsatisfied check node U1 (i.e., U1≠U2). In a manner analogous to action 408, post processor 218 (i) selects a $P_n$ value corresponding to a bit B2 connected to unsatisfied check node U2, and (ii) adjusts the $P_n$ value. The adjusted $P_n$ value replaces the corresponding saturated $P_n$ value in memory. Thus, 718 saturated $P_n$ values, one adjusted $P_n$ value corresponding to U1, and one adjusted $P_n$ value corresponding to U2 are stored in memory.

Post processor 218 provides 720 $P'_n$ values (i.e., 718 saturated $P_n$ values from action 404 and two adjusted $P_n$ values from actions 406 and 412) to VNUs 208(0)-(71) and multiplexers 210(0)-(3) via multiplexer 206 and performs decoding (action 414) as described above in relation to FIG. 2 using the $P'_n$ values in lieu of the channel soft-input values $La_n^{(0)}$. Note that the 720 $P'_n$ values stored in memory are not modified during a local iteration of LDPC decoding. If LDPC decoder 200 converges on a valid codeword within a specified number of iterations (decision 416), then a CRC check (action 418) is performed in a manner analogous to that described above. If the CRC check passes, then decoding is stopped for the subject codeword. If the CRC check fails, then further actions 420 may be performed as discussed above, such as a retransmission of the data or performance of one or more global iterations of the turbo decoder.

If LDPC decoder 200 does not converge on a valid codeword within a specified number of iterations (action 416), then post processor 218 performs action 422 to store (i) the indices of the unsatisfied check nodes as set USC2 and (ii) the number of unsatisfied check nodes as parameter USCN2. The indices of unsatisfied check nodes in the set USC2 and number USCN2 of unsatisfied check nodes are determined from the syndrome of the last (i.e., failed) decoder iteration of first stage 400. Post processor 218 determines (i) the difference between the number USCN1 of check nodes in set USC1 and the number USCN2 of check nodes in USC2 and (ii) whether the magnitude of that difference is less than or equal to a specified threshold (e.g., 2) (action 424). If the magnitude is not less than or equal to the threshold, then post processor 218 determines whether all of the possible B1 and B2 bit combinations have been considered (decision 426) (i.e., all possible pairs of bits connected to the USCs in the set USC1).

If all of the combinations have not been considered, then post processor 218 resets the adjusted $P_n$ values corresponding to bits B1 and B2 to their saturated values in State 0 (action 428). In particular, the sign bits of the adjusted $P_n$ values corresponding to bits B1 and B2 are flipped back (i.e., a 1 becomes a 0 and a 0 becomes a 1), and the magnitude of the resulting $P_n$ values are set to relatively small values (e.g., if hard decision=0, then $P_n$ is set to −2, and if hard decision=1, then $P_n$ is set to +2). Then, processing returns to action 406 to perform another iteration of first stage 400 in which a different pair of bits B1 and B2 is selected. This process may be repeated until all possible bit pairs have been considered. If all bit pairs have been considered (decision 426), then further actions 420 may be performed to break the trapping set, such as performing other post-processing methods, retransmission of the data, or performance of one or more global iterations of the turbo decoder.

Returning to decision 424, if the magnitude is less than or equal to the threshold, then processing proceeds to second stage 450 of FIG. 4B, which performs one or more single-bit targeted bit adjustment trials. In particular, post processor 218 initializes LDPC decoder 200 to State 1 (action 452). In so doing, post processor 218, which receives 720 $P_n$ values output from VNUs 208(0)-(71) during the last decoder iteration of first stage 400 at a rate of 72 $P_n$ values per clock cycle, sets all 720 $P_n$ values to a relatively small value in a manner analogous to that described above for action 404 (e.g., saturating each $P_n$ value to ±2). As in State 0, the 720 initialized State 1 $P_n$ values are stored in memory for possible future use. Once LDPC decoder 200 is initialized to State 1, post processor 218 (i) selects an unsatisfied check node U3 from the set USC2 of unsatisfied check nodes (action 454), and (ii) selects a $P_n$ value corresponding to a bit B3 connected to unsatisfied check node U3 (action 456). Bit B3 could be the same as bit B1 or B2. Alternatively, post processor 218 could disqualify any bits selected as bit B1 or B2 from being selected as bit B3. Post processor 218 adjusts the selected $P_n$ value by flipping the hard-decision bit and setting the magnitude of the resulting $P_n$ value to a relatively large value (e.g., if hard decision=0, then $P_n$ is set to −16, and if hard decision=1, then $P_n$ is set to +15) in a manner analogous to that of action 408. The adjusted $P_n$ value replaces the corresponding saturated $P_n$ value in memory. Thus, 719 saturated $P_n$ values and one adjusted $P_n$ value corresponding to U3 are stored in memory.

Post processor 218 provides 720 $P'_n$ values (i.e., 719 saturated $P_n$ values and one adjusted $P_n$ value) to VNUs 208(0)-(71) and multiplexers 210(0)-(3) via multiplexer 206 and performs decoding (action 458) as described above in relation to FIG. 2 using the $P'_n$ values in lieu of the channel soft-input values $La_n^{(0)}$. Note that the 720 $P'_n$ values stored in memory are not modified during a local iteration of LDPC decoding. If LDPC decoder 200 converges on a valid codeword within a specified number of iterations (decision 460), then a CRC check (action 462) is performed in a manner analogous to that described above. If the CRC check passes, then decoding is stopped for the subject codeword. If the CRC check fails, then further actions 464 may be performed as discussed above, such as a retransmission of the data or performance of one or more global iterations of the turbo decoder.

If LDPC decoder 200 does not converge on a valid codeword within a specified number of iterations, then post processor 218 performs action 466 to determine whether all of the possible bits B3 have been considered (i.e., all bits connected to the USCs in the set USC2). If all of the possible bits B3 have not been considered, then post processor 218 resets the adjusted $P'_n$ value corresponding to bit B3 to its saturated value in State 1 (action 468). In particular, the sign bit of the adjusted $P'_n$ value is flipped back (i.e., a 1 becomes a 0, and a 0 becomes a 1), and the magnitude of the resulting $P_n$ value is set to a relatively small value (e.g., if hard decision=0, then $P_n$ is set to −2, and if hard decision=1, then $P_n$ is set to +2). Then, processing returns to action 454 to perform another iteration of second stage 450 in which a different bit B3 is selected. This process may be repeated until all possible bits B3 have been considered. If all possible bits have been considered (decision 466), then processing returns to action 404 of first stage 400 to perform another two-bit targeted bit adjustment trial.

According to various embodiments of the present invention, post processor 218 may select bits B1 and B2 from a set of suspicious bit nodes (SBNs), rather than from all bit nodes associated with the unsatisfied check nodes in set USC1 (i.e., all associated bit nodes (ABNs)). A set of suspicious bit nodes corresponding to USC1 is a subset of set USC1, where each suspicious bit node in the set is a bit node that is most likely to be an erroneous bit node. Thus, any bit nodes that are not likely to be erroneous are excluded from the set of suspicious bit nodes. Similarly, post processor 218 may select bit B3 from a set of suspicious bit nodes corresponding to set USC2. A discussion of selecting suspicious bit nodes may be found in U.S. patent application Ser. No. 12/401,116. The following discussion provides a brief summary of some of those teachings.

Suspicious bit nodes may be identified using any suitable method. According to one class of SBN-identification methods, known as value-comparison methods, post processor 218 selects a set (i.e., node set) of one or more unsatisfied check nodes (e.g., USC1 or USC2) and/or associated bit nodes. Post processor 218 selects a first node from the node set, and takes a first value associated with the first node, e.g., an $R_{mn}$ message value, and compares it a second value of a like kind, e.g., another $R_{mn}$ message value, associated with the same node. The second value can be from the same iteration/sub-iteration, or it can be from another iteration/sub-iteration. If the difference between compared values exceeds a specified threshold, then either the bit node associated with the first value or the bit node associated with the second value is added to the set of suspicious bit nodes. This process is repeated for each additional node in the node set.

According to various value-comparison methods, referred to as an ABN-based value-comparison methods, the node selected from the node set is an associated bit node. In an ABN-based value-comparison method, the values available for comparison are the $R_{mn}$ message values, $Q_{nm}$ message values, and $P_n$ values corresponding to the associated bit node. Furthermore, the comparison is between the complete values, i.e., both the sign bit and magnitude bits. If the difference between compared values exceeds a specified threshold, then the associated bit node is added to the set of suspicious bit nodes.

According to other value-comparison methods, referred to as USC-based value-comparison methods, the node selected from the node set is an unsatisfied check node. In a USC-based value-comparison method, the values available for comparison are the $R_{mn}$ and $Q_{nm}$ message values (i.e., not $P_n$ values). Furthermore, the comparison is between only the magnitudes of the two LLRs. If the difference between compared values exceeds a specified threshold, then either the bit node associated with the first value or the bit node associated with the second value is added to the set of suspicious bit nodes.

The values compared in the ABN-based or USC-based value-comparison methods may be values corresponding to the same iteration, the same sub-iteration, different iterations, or different sub-iterations. For example, an inter-iteration comparison may be made by comparing an R message $R_{25}^7$ corresponding check node 2 to bit node 5 in decoding iteration 7 to an R message $R_{25}^6$ corresponding to check node 2 to bit node 5 in decoding iteration 6. As another example, an intra-iteration comparison may be made by comparing an R message $R_{25}^7$ corresponding check node 2 to bit node 5 in decoding iteration 7 to an R message $R_{28}^7$ corresponding to check node 2 to bit node 8 in the same decoding iteration.

According to another class of methods, a set of suspicious bit nodes may be selected from the associated bit nodes whose corresponding $P_n$ values grow so large that they are saturated within a specified number of decoding iterations.

According to yet another class of methods, a set of suspicious bit nodes may be selected from the associated bit nodes whose corresponding $P_n$ values and extrinsic LLR values have opposite signs, e.g., a positive $P_n$ value and a negative extrinsic LLR value, or vice versa.

According to even yet another class of methods, a set of suspicious bit nodes may be selected from the associated bit nodes whose corresponding $P_n$ values and channel input values $La_n^{(0)}$ values have opposite signs.

Although first and second stages 400 and 450 were described as performing two-bit and single-bit targeted bit adjustment trials, respectively, the present invention is not so limited. First stage 400 may perform single-bit or multi-bit targeted bit adjustment trials, where one or more bits are adjusted in each trial. Similarly, second stage 450 may perform single-bit or multi-bit targeted bit adjustment trials.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

Although the present invention has been described relative to the specific non-layered LDPC decoder configuration 200 of FIG. 2, the present invention is not so limited. Various embodiments of the present invention may also be envisioned for other LDPC decoder structures that employ message passing. For example, the technique of FIG. 4 may be implemented for other non-layered or for layered decoder structures, and decoders that use message-passing schedules other than a block-serial message-passing schedule. An example of a layered-LDPC decoder may be found in, for example, U.S. patent application Ser. No. 12/475,786.

According to various embodiments, the present invention may be implemented using check-node algorithms other than the offset min-sum algorithm. For example, such embodiments may use a scaled min-sum algorithm, or any soft-input/soft-output algorithms other than the min-sum algorithm, such as a sum-product algorithm (SPA) or the Bahl-Cocke-Jelinek-Raviv (BCJR) algorithm.

Embodiments of the present invention may be performed using erasing in lieu of the adjustment method described above in relation to actions 408, 412, and 456. Erasing is another process for altering bit-node values. Erasing a bit node comprises (i) setting the hard-decision value of that bit node's $L_{ch}$ value to 0 and (ii) setting the magnitude bits, i.e., the confidence, of that same $L_{ch}$ value to 0, i.e., no confidence.

Some trapping sets can be broken by flipping or erasing a single EBN. In other trapping sets, flipping or erasing a single erroneous bit nodes may reduce the number of unsatisfied check nodes, but not break the trapping set entirely, yielding a second, different trapping set. Yet other trapping sets can be broken only by flipping or erasing two or more EBNs at the same time.

Although the present invention was described relative to the specific H-matrix 100 of FIG. 1, the present invention is not so limited. The present invention may be implemented for various H-matrices that are suitable for message-passing decoding and that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, cyclic, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices. Note that the number of VNUs, barrel shifters, and/or CNUs may vary according to the characteristics of the H-matrix.

It will be further understood that various changes in the details, materials, and arrangements of the parts which have been described and illustrated in order to explain the nature of this invention may be made by those skilled in the art without departing from the scope of the invention as expressed in the following claims.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A receiver-implemented method for recovering an error correction-encoded codeword, the method comprising:
    (a) performing a first stage of error correction decoding on a first set of input values to generate a first set of output values, one or more of which correspond to one or more first-stage unsatisfied check nodes;
    (b) performing a second stage of error correction decoding on a second set of input values to generate a second set of output values, one or more of which correspond to one or more second-stage unsatisfied check nodes, wherein:
        the second set of input values is based on the first set of output values; and
        one or more of the input values of the second set of input values are generated by adjusting one or more corresponding output values of the first set of output values, wherein each of the one or more corresponding output values of the first set of output values is associated with a first-stage unsatisfied check node;
    (c) comparing a difference of (i) the number of first-stage unsatisfied check nodes and (ii) the number of second-stage unsatisfied check nodes to a specified threshold value;
    (d) selecting a subsequent stage of error correction decoding based on the comparison of step (c); and
    (e) performing the selected subsequent stage of error correction decoding.

2. The invention of claim 1, wherein the selected subsequent stage of error correction decoding is an additional instance of the second stage of error correction decoding, if the difference has a magnitude greater than the specified threshold.

3. The invention of claim 2, wherein for the additional instance of the second stage:
    the second set of input values is based on the first set of output values; and
    the one or more corresponding output values of the first set of output values that are adjusted during the additional instance of the second stage are different from the one or more corresponding output values of the first set of output values that are adjusted during other instances of the second stage.

4. The invention of claim 1, wherein the selected subsequent stage of error correction decoding is a third stage of error correction decoding different from the second stage of error correction decoding, if the difference has a magnitude less than the specified threshold.

5. The invention of claim 4, wherein the third stage of error correction decoding comprises:
    performing error correction decoding on a third set of input values to generate a third set of output values, wherein:
        the third set of input values is based on the second set of output values; and
        one or more of the input values in the third set of input values are generated by adjusting one or more corresponding output values of the second set of output values, wherein each of the one or more corresponding output values of the second set of output values is associated with a second-stage unsatisfied check node.

6. The invention of claim 5 comprising performing, if the third stage of error correction decoding fails to recover the error correction-encoded codeword, an additional instance of the third stage of error correction decoding, wherein for the additional instance:
the third set of input values corresponds to the second set of output values; and
the one or more corresponding output values of the second set of output values that are adjusted during the additional instance of the third stage are different from the one or more corresponding output values of the second set that are adjusted during other instances of the third stage.

7. The invention of claim 1, wherein the second stage of error correction decoding is performed after the first stage of error correction decoding fails to recover the error correction-encoded codeword.

8. The invention of claim 1, wherein the comparison of step (c) is performed after the second stage of error correction decoding fails to recover the error correction-encoded codeword.

9. The invention of claim 1, wherein:
the one or more input values in step (b) comprise two or more input values in the second set of input values, wherein:
the two or more input values are generated by adjusting two or more corresponding output values of the first set of output values; and
the two or more corresponding output values of the first set of output values are associated with different unsatisfied check nodes of the first stage.

10. The invention of claim 9, wherein:
the selected subsequent stage of error correction decoding is an additional instance of the second stage of error correction decoding, if the difference has a magnitude greater than the specified threshold; and
for the additional instance of the second stage:
the second set of input values is based on the first set of output values; and
the two or more corresponding output values of the first set of output values that are adjusted during the additional instance of the second stage are different from the two or more corresponding output values of the first set of output values that are adjusted during other instances of the second stage.

11. The invention of claim 1, wherein generating the second set of input values comprises (i) flipping sign bits of the one or more corresponding output values of the first set of output values and (ii) retaining sign bits of any remaining output values of the first set of output values.

12. The invention of claim 11, wherein generating the second set of input values further comprises adjusting confidence values of the first set of output values such that magnitudes of the adjusted confidence values of the one or more corresponding output values of the first set of output values are greater than magnitudes of the adjusted confidence values of the remaining output values of the first set of output values.

13. The invention of claim 1, wherein:
the error correction-encoded codeword is a low-density parity-check-encoded codeword; and
the first, second, and third stages of error correction decoding perform low-density parity-check decoding.

14. Apparatus for recovering an error correction-encoded codeword, the apparatus comprising:
an error correction decoder; and
a controller that controls the error correction decoder, wherein:
the error correction decoder performs a first stage of error correction decoding on a first set of input values to generate a first set of output values, one or more of which correspond to one or more first-stage unsatisfied check nodes;
the error correction decoder performs a second stage of error correction decoding on a second set of input values to generate a second set of output values, one or more of which correspond to one or more second-stage unsatisfied check nodes, wherein:
the second set of input values is based on the first set of output values; and
one or more of the input values of the second set of input values are generated by adjusting one or more corresponding output values of the first set of output values, wherein each of the one or more corresponding output values of the first set of output values is associated with a first-stage unsatisfied check node;
the controller compares a difference of (i) the number of first-stage unsatisfied check nodes and (ii) the number of second-stage unsatisfied check nodes to a specified threshold value;
the controller selects a subsequent stage of error correction decoding based on the comparison; and
the error correction decoder performs the selected subsequent stage of error correction decoding.

15. The invention of claim 14, wherein the controller selects an additional instance of the second stage of error correction decoding as the subsequent stage of error correction decoding, if the difference has a magnitude greater than the specified threshold, wherein for the additional instance of the second stage:
the second set of input values is based on the first set of output values; and
the one or more corresponding output values of the first set of output values that are adjusted during the additional instance of the second stage are different from the one or more corresponding output values of the first set of output values that are adjusted during other instances of the second stage.

16. The invention of claim 14, wherein the controller selects a third stage of error correction decoding, different from the second stage of error correction decoding, as the subsequent stage, if the difference has a magnitude less than the specified threshold, wherein for the third stage of error correction decoding:
the error correction decoder performs error correction decoding on a third set of input values to generate a third set of output values, wherein:
the third set of input values is based on the second set of output values; and
one or more of the input values of the third set of input values are generated by adjusting one or more corresponding output values of the second set of output values, wherein each of the one or more corresponding output values of the second set of output values is associated with a second-stage unsatisfied check node.

17. The invention of claim 14, wherein:
the one or more input values in the second stage of error correction decoding comprise two or more input values in the second set of input values, wherein:
   the two or more input values are generated by adjusting two or more corresponding output values of the first set of output values; and
   the two or more corresponding output values of the first set of output values are associated with different unsatisfied check nodes of the first stage.

18. The invention of claim 17, wherein:
the controller selects an additional instance of the second stage of error correction decoding as the subsequent stage of error correction decoding, if the difference has a magnitude greater than the specified threshold; and
for the additional instance of the second stage:
   the second set of input values is based on the first set of output values; and
   the two or more corresponding output values of the first set of output values that are adjusted during the additional instance of the second stage are different from the two or more corresponding output values of the first set of output values that are adjusted during other instances of the second stage.

19. The invention of claim 14, wherein generating the second set of input values comprises (i) flipping sign bits of the one or more corresponding output values of the first set of output values and (ii) retaining sign bits of any remaining output values of the first set of output values.

20. The invention of claim 19, wherein generating the second set of input values further comprises adjusting confidence values of the first set of output values such that magnitudes of the adjusted confidence values of the one or more corresponding output values of the first set of output values are greater than magnitudes of the adjusted confidence values of the remaining output values of the first set of output values.

21. The invention of claim 14, wherein:
the error correction-encoded codeword is a low-density parity-check-encoded codeword; and
the error correction decoder is and low-density parity-check decoder.

* * * * *